(12) United States Patent
Oshima et al.

(10) Patent No.: US 8,592,316 B2
(45) Date of Patent: Nov. 26, 2013

(54) NITRIDE SEMICONDUCTOR SUBSTRATE, PRODUCTION METHOD THEREFOR AND NITRIDE SEMICONDUCTOR DEVICE

(75) Inventors: Yuichi Oshima, Tsuchiura (JP); Takehiro Yoshida, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 447 days.

(21) Appl. No.: 12/805,477

(22) Filed: Aug. 2, 2010

(65) Prior Publication Data

US 2011/0248281 A1    Oct. 13, 2011

(30) Foreign Application Priority Data

Apr. 8, 2010   (JP) ................................ 2010-089755

(51) Int. Cl.
    *H01L 33/00*      (2010.01)
    *H01L 21/18*      (2006.01)

(52) U.S. Cl.
USPC ........... 438/693; 438/959; 438/689; 257/615; 257/628; 257/E21.483; 257/E21.237; 257/E21.23; 257/E21.214

(58) Field of Classification Search
USPC .................. 438/692, 693, 959, 689; 257/615, 257/E21.483, E21.237, E21.23, E21.214, 257/628
See application file for complete search history.

(56) References Cited

U.S. PATENT DOCUMENTS

| | | | |
|---|---|---|---|
| 7,416,604 B2 | 8/2008 | Ishibashi et al. | |
| 7,851,381 B2 * | 12/2010 | Ishibashi et al. | 438/765 |
| 8,139,620 B2 * | 3/2012 | Miyoshi et al. | 372/46.01 |
| 8,192,543 B2 * | 6/2012 | Ishibashi et al. | 117/84 |
| 2006/0292728 A1 | 12/2006 | Ishibashi et al. | |
| 2010/0123168 A1 | 5/2010 | Ishibashi et al. | |
| 2011/0110840 A1 * | 5/2011 | Miyanaga et al. | 423/409 |

FOREIGN PATENT DOCUMENTS

| | | |
|---|---|---|
| JP | 2001-322899 A | 11/2001 |
| JP | 2004-311575 A | 11/2004 |
| JP | 2007-5526 A | 1/2007 |
| WO | WO 2010007867 A1 * | 1/2010 |

OTHER PUBLICATIONS

Reiher, et al., "Depth-resolving structural analysis of GaN layers by skew angle x-ray diffraction," Applied Physics Letters, vol. 84, No. 18, May 3, 2004, pp. 3537-3539.
W.C. Marra, et al., "x-ray total-external-reflection-Bragg diffraction: A structural study of the GaAs-Al interface," J. Appl. Phys., vol. 50, No. 11, Nov. 1979, pp. 6928-6933.

* cited by examiner

*Primary Examiner* — Tom Thomas
*Assistant Examiner* — Benjamin Tzu-Hung Liu
(74) *Attorney, Agent, or Firm* — McGinn IP Law Group, PLLC (57) ABSTRACT

A nitride semiconductor substrate includes two principal surfaces including an upper surface that is a growth face and a lower surface on its opposite side. An FWHM in a surface layer region at depths of from 0 to 250 nm from the upper surface is narrower than an FWHM in an inner region at depths exceeding 5 μm from the upper surface, where the FWHMs are obtained by X-ray rocking curve measurement using diffraction off a particular asymmetric plane inclined relative to the upper surface.

12 Claims, 8 Drawing Sheets

| | |
|---|---|
| 101 GaN SUBSTRATE | 121 p-AlGaN LAYER |
| 102 n-GaN LAYER | 122 p-GaN LAYER |
| 111 InGaN WELL LAYER | 124 NEGATIVE ELECTRODE |
| 112 GaN BARRIER LAYER | 125 POSITIVE ELECTRODE |

| 101 GaN SUBSTRATE | 121 p-AlGaN LAYER |
| 102 n-GaN LAYER | 122 p-GaN LAYER |
| 111 InGaN WELL LAYER | 124 NEGATIVE ELECTRODE |
| 112 GaN BARRIER LAYER | 125 POSITIVE ELECTRODE |

NITRIDE SEMICONDUCTOR SUBSTRATE, PRODUCTION METHOD THEREFOR AND NITRIDE SEMICONDUCTOR DEVICE

The present application is based on Japanese patent application No. 2010-089755 filed on Apr. 8, 2010, the entire contents of which are incorporated herein by reference.

BACKGROUND OF THE INVENTION

1. Field of the Invention

This invention relates to a nitride semiconductor substrate, a production method therefor, and a nitride semiconductor device. In particular, it relates to a group III nitride semiconductor single crystal substrate, a production method therefor, and a nitride semiconductor device using these.

2. Description of the Related Art

For blue light emitting diode (LED) or laser diode (LD) materials, nitride semiconductors, for example, group III nitride semiconductors such as gallium nitrides (GaN), indium gallium nitrides (InGaN), aluminum gallium nitrides (AlGaN), and the like, are in the limelight. Further, for electronic device elements, the application and development of group III nitride semiconductors have begun because of their good heat resistance or environment resistance.

In order for these devices to have enhanced performance, it is important to lessen crystal defects (principally, dislocations) in an epitaxial layer (a semiconductor layer epitaxially grown over a substrate) of the devices. Originally used for the above substrate in the nitride semiconductor device fabrication is a hetero-substrate such as sapphire or the like. The hetero-substrate causes high density dislocations due to its lattice constant being significantly different from the lattice constant of the epitaxial layer. To avoid this to produce the high quality epitaxial crystal (semiconductor crystal epitaxially grown over the substrate), effectively used for the above substrate is a high quality nitride semiconductor single crystal substrate, which is highly lattice matched to the epitaxial layer.

Of such nitride semiconductors, the GaN single crystal is not easy to grow because its melt is produced only at an ultra high pressure, but attempts to grow the GaN single crystal have been made with various methods such as an ultra high temperature and high pressure method, a flux method, an HVPE (halide vapor phase epitaxy) method, and the like. Of these, the HVPE (halide vapor phase epitaxy) method is the most developed GaN substrate production method. Specifically, HVPE produced GaN freestanding substrates (substrates having a strength not only being capable of holding its shape but causing no inconvenience in handling) have already been available commercially mainly for use in optical disc LDs, and are greatly expected for future use in super luminosity LEDs, as well as LDs.

SUMMARY OF THE INVENTION

Although the HVPE produced nitride semiconductor single crystal substrates have been thus used practically, there is yet much room left for improvement in their properties. For example, there is a problem with their surface quality. Generally, even when the surface (grown surface) of semiconductor single crystal substrates is ground, it is important to leave no damage to the ground surface. The known and widely used method to prevent residual damage to the surface as much as possible is chemical mechanical polishing (CMP). However, the CMP of nitride semiconductor crystals such as GaN is not easy. This is because nitride semiconductors are mechanically hard but fragile, and chemically very stable. For the time being, however, the CMP method such as that disclosed by JP-A-2004-311575 has been developed that has produced surface quality possible to be used practically. Also, effective is the removal of a damaged layer by dry etching after mechanical polishing, as disclosed by JP-A-2001-322899. As it stands, however, the GaN crystals produced with the hetero epitaxial technique still have many crystal defects in comparison with semiconductor crystals such as silicon (Si), gallium arsenic (GaAs), and the like, and even the use of the above CMP technique cannot overcome the existence of high density crystal defects in the surface of the GaN crystals, which is still an impediment to enhancement of performance of the devices of each kind. JP-A-2007-5526, Appl. Phys. Lett. 84 (2004) 3537 and J. Appl. Phys. 50 (1979) 6927 are referred to later.

Accordingly, it is an object of the present invention to provide a nitride semiconductor substrate whose outermost surface (surface layer region) has much more excellent quality than its inner region, a production method therefor by devising a surface treating method capable of relieving strain in the outermost surface to provide the high quality outermost surface layer, and a nitride semiconductor device using the nitride semiconductor substrate, and the production method therefor.

(1) According to one embodiment of the invention, a nitride semiconductor substrate comprises two principal surfaces comprising an upper surface that is a growth face and a lower surface on its opposite side, wherein an FWHM (=full width at half maximum) in a surface layer region at depths of from 0 to 250 nm from the upper surface is narrower than an FWHM in an inner region at depths exceeding 5 µm from the upper surface, where the FWHMs are obtained by X-ray rocking curve measurement using diffraction off a particular asymmetric plane inclined relative to the upper surface.

In the above embodiment (1) of the invention, the following modifications and changes can be made.

(i) The nitride semiconductor substrate comprises a GaN freestanding substrate, an AlN freestanding substrate, or an $Al_xGa_{1-x}N$ freestanding substrate (0<x<1).

(ii) The FWHM in the surface layer region is not more than 90% of the FWHM in the inner region.

(iii) The asymmetric plane is chosen so as to satisfy a specific condition shown below:

when an apex of a virtual cone, whose axis is normal to the asymmetric plane and an apex angle of (180-2θ) degrees (θ: Bragg angle of the asymmetric plane), is put on the sample surface, the virtual cone and the sample surface intersect each other.

(iv) The upper surface is a {0001} plane or a plane slightly inclined at not more than 10 degrees thereto, while the asymmetric plane is a {10-11}, {10-12}, {10-13}, {20-21}, or {11-22} plane.

(v) The upper surface is a {10-10} plane or a plane slightly inclined at not more than 10 degrees thereto, while the asymmetric plane is a {10-11}, {10-12}, {10-13}, {10-14}, {10-15}, {10-16}, {11-20}, or {11-22} plane.

(vi) The upper surface is a {11-20} plane or a plane slightly inclined at not more than 10 degrees thereto, while the asymmetric plane is a {10-10} or {11-22} plane.

(vii) The upper surface is a {11-22} plane or a plane slightly inclined at not more than 10 degrees thereto, while the asymmetric plane is a {0001} or {11-20} plane.

(viii) The upper surface is a {10-11} plane or a plane slightly inclined relative thereto, while the asymmetric plane is a {0001} or {10-10} plane.

(ix) The upper surface is a {10-12} plane or a plane slightly inclined relative thereto, while the asymmetric plane is a {0001}, {10-10}, or {10-11} plane.

(x) The upper surface is a {20-21} plane or a plane slightly inclined relative thereto, while the asymmetric plane is a {0001}, {10-12}, {10-13}, {10-14}, or {10-15} plane.

(2) According to another embodiment of the invention, a method for producing the nitride semiconductor substrate according to the above embodiment (1) comprises:

mechanically polishing or grinding a surface of a single crystal to form a principal surface so that a root mean square (RMS) is not more than 5 nm;

subsequently chemically mechanically polishing (CMP) with colloidal silica or dry etching the surface to reduce damage caused by the mechanical polishing or the surface grinding so that the RMS is not more than 2 nm; and subsequently dripping onto the surface a not more than 2 mol % ammonium fluoride containing solution with not more than 100 nm particle diameter gallium oxide nanopowder added thereto, and irradiating the surface with ultraviolet rays over 1 hour, to apply friction to the surface.

(3) According to another embodiment of the invention, a nitride semiconductor device comprises the nitride semiconductor substrate, and an epitaxial layer comprising a nitride semiconductor substrate crystal formed over the nitride semiconductor substrate according to the above embodiment (1).

POINTS OF THE INVENTION

According to one embodiment of the invention, an FWHM in a surface layer region at depths of from 0 to 250 nm from the upper surface is narrower than an FWHM in an inner region at depths exceeding 5 μm from the upper surface, where the FWHMs are obtained by X-ray rocking curve measurement using diffraction off a particular asymmetric plane inclined relative to the upper surface. That is, it is possible to inhibit variation in crystalline orientation in the surface layer region at the depths of from 0 to 250 nm from the upper surface more than in the inner region at the depths exceeding 5 μm from the upper surface. It is therefore possible to provide the nitride semiconductor single crystal substrate, only the outermost surface of which is remarkably excellent in crystalline quality compared to its inside.

Thus, according to one embodiment of the invention, it is possible to provide a nitride semiconductor substrate whose outermost surface (surface layer region) has much more excellent quality than its inner region, a production method therefor by devising a surface treating method capable of relieving strain in the outermost surface to provide the high quality outermost surface layer, and a nitride semiconductor device using the nitride semiconductor substrate, and the production method therefor.

Therefore, when a mother crystal with a same crystalline quality as a conventional one is used, it is possible to provide a substantially high crystalline quality nitride semiconductor substrate as compared to a conventional one. In other words, a nitride semiconductor substrate with a same surface crystalline quality as a conventional one can be obtained by using a mother crystal with lower quality.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Generally, in practice, the crystalline quality of surface treated is no better than the quality of the inside of that crystal. For example, JP-A-2007-5526 listed above discloses a GaN substrate which is produced by devising the CMP method to lessen damage to its surface as much as possible, and which thereby allows the difference in rocking curve FWHMs in regions at depths of 0.3 μm and 5 μm respectively from the surface in X-ray diffraction off a particular lattice plane to be not more than 120 seconds. In view of this, to further improve the surface quality, it is clear that the defect density of that crystal itself should be reduced. However, that is not easy, but may in most cases lead to an increase in cost or a decrease in homogeneity.

Now, the most important role of the substrate in epitaxial layer growth of the device is crystal arrangement information transmission to the epitaxial layer. The outermost surface of the substrate, i.e., the growth face has this role. Because when there are many defects in the growth face for growing the epitaxial layer, that information including the defect information is transmitted to the epitaxial layer, it is necessary to reduce the defects. Conversely, even when there are defects inside from the surface, that information is not transmitted to the epitaxial layer. In other words, if one focuses on the crystal information transmission function, the quality of the substrate then depends on the quality of its outermost surface.

Nitride Semiconductor Substrate

Based on the foregoing findings, an object of the invention is to provide one semiconductor single crystal substrate, only the outermost surface of which is remarkably excellent in crystalline quality compared to its inside. Specifically, a nitride semiconductor substrate includes two principal surfaces comprising an upper surface that is a growth face and a lower surface on its opposite side, and is constructed such that an FWHM in a surface layer region at depths of from 0 to 250 nm from the upper surface is narrower than an FWHM in an inner region at depths exceeding 5 μm from the upper surface, where the FWHMs are obtained by X-ray rocking curve measurement using diffraction off a particular asymmetric plane inclined relative to the upper surface.

In this case, the nitride semiconductor substrate is not limited in particular, but may preferably be a GaN freestanding substrate, an AlN freestanding substrate, or an $Al_xGa_{1-x}N$ freestanding substrate (0<x<1), for example.

The FWHM in the surface layer region is preferably not more than 90% of the FWHM in the inner region. It is more preferably not more than 80%, most preferably not more than 65% thereof.

Also, the asymmetric plane is preferably chosen so as to satisfy a specific condition shown below:

when an apex of a virtual cone, whose axis is normal to the asymmetric plane and an apex angle of (180-2θ) degrees (θ: Bragg angle of the asymmetric plane), is put on the sample surface, the virtual cone and the sample surface intersect each other. This allows incident X-rays to approach grazingly to the sample surface and result in Bragg diffraction, and thereby provide the information on crystalline quality at a very shallow depth of the sample.

The upper surface may be a {0001} plane or a plane slightly inclined at not more than 10 degrees thereto, while the asymmetric plane may be a {10-11}, {10-12}, {10-13}, {20-21}, or {11-22} plane.

Also, the upper surface may be a {10-10} plane or a plane slightly inclined at not more than 10 degrees thereto, while the asymmetric plane may be a {10-11}, {10-12}, {10-13}, {10-14}, {10-15}, {10-16}, {11-20}, or {11-22} plane.

Also, the upper surface may be a {11-20} plane or a plane slightly inclined at not more than 10 degrees thereto, while the asymmetric plane may be a {10-10} or {11-22} plane.

Also, the upper surface may be a {11-22} plane or a plane slightly inclined at not more than 10 degrees thereto, while the asymmetric plane may be a {0001} or {11-20} plane.

Also, the upper surface may be a {10-11} plane or a plane slightly inclined relative thereto, while the asymmetric plane may be a {0001} or {10-10} plane.

Also, the upper surface may be a {10-12} plane or a plane slightly inclined relative thereto, while the asymmetric plane may be a {0001}, {10-10}, or {10-11} plane.

Further, the upper surface may be a {20-21} plane or a plane slightly inclined relative thereto, while the asymmetric plane may be a {0001}, {10-12}, {10-13}, {10-14}, or {10-15} plane.

Nitride Semiconductor Substrate Production Method

Also, this substrate is produced by a production method of the invention, in which the typical CMP process is followed by special surface treatment as described below. Specifically, this production method comprises mechanically polishing or grinding a surface of a single crystal to form a principal surface so that a root mean square (RMS) is not more than 5 nm; chemically mechanically polishing (CMP) with colloidal silica or dry etching the surface to reduce damage caused by the mechanical polishing or the surface grinding so that the RMS is not more than 2 nm; and dripping onto the surface a not more than 2 mol % ammonium fluoride containing solution with not more than 100 nm particle diameter gallium oxide nanopowder added thereto, and irradiating the surface with ultraviolet rays over 1 hour, to apply friction to the surface.

It has to be said that the effective surface treatment conditions and the surface treatment effect mechanism are still in the trial and error stage, and on the way to elucidation. Accordingly, the surface treatment conditions used in the present invention should be understood as one example, and the optimum possible conditions at the present stage. Also, the occurrence of the surface treatment effect mechanism is considered to be because the atomic arrangement in the outermost surface layer is varied by some chemical action to relieve strain therein, but it has not been thoroughly elucidated. The specific production method is described in detail in Examples below.

A further object of the invention is to provide a nitride semiconductor device comprising the above-described nitride semiconductor substrate, and an epitaxial layer comprising a nitride semiconductor substrate crystal formed over the nitride semiconductor substrate.

Figure 1:
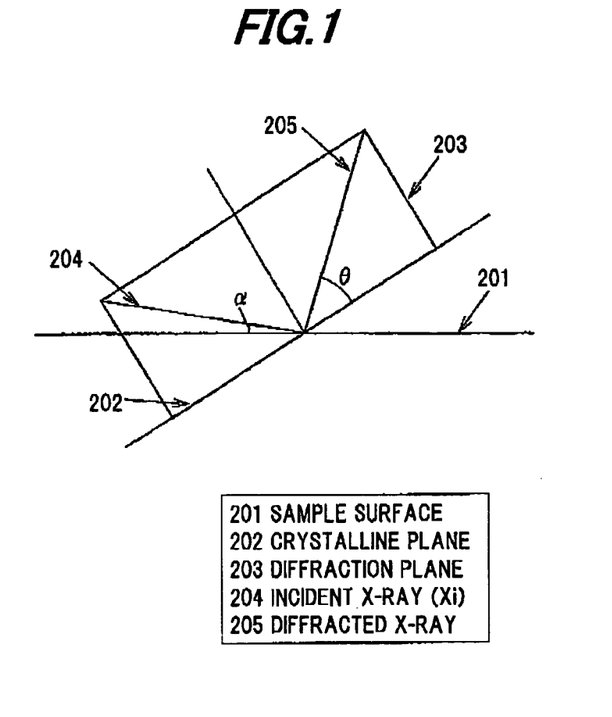
FIG. 1 is an explanatory diagram showing a typical example of arrangement during X-ray measurement of surface quality (surface damage) of nitride semiconductor substrates, in Examples and Comparative examples for a nitride semiconductor substrate and a production method therefor of the invention.

Next is described a method for evaluating the surface layer quality of the substrate. The known method to sensitively measure strain in the surface layer is X-ray diffraction measurement described below (see, for example, previously listed Appl. Phys. Lett. 84 (2004) 3537). This method uses different incident X-ray angles to measure diffraction (so-called asymmetric reflection) off a crystalline plane inclined relative to the surface while satisfying the same Bragg diffraction conditions. This method is further described in detail, referring to FIG. 1. It is assumed that diffraction occurs at a Bragg angle θ to a crystalline plane 202. To satisfy such conditions, an incident X-ray Xi 204 lies on a conical surface which has an apex angle of (180-2θ) degrees and a normal to that crystalline plane at its central axis. In this case, when the crystalline plane 202 to measure is inclined relative to a sample surface 201 (i.e. the substrate surface), an angle α formed by the incident X-ray Xi 204 and the sample surface 201 on a diffraction plane 203 (plane formed by the incident X-ray Xi 204 and the diffracted X-ray 205, and depicted as being parallel to the page in FIG. 1) varies according to the incident direction of the incident X-ray Xi 204. With varying angle α, the penetration depth of the X-ray into the sample varies. That is, the smaller the angle α, the shallower the penetration depth of the X-ray into the sample. That is, the penetration depth at which the information is obtained can be controlled, depending on the incident direction of the incident X-ray Xi 204. In particular, when a portion of the above-described conical surface is arranged to be intersected by the sample surface, the incident angle of the incident X-ray Xi 204 to the surface can be very shallow, and the information on crystalline quality at a very small depth from the surface can therefore be obtained. The penetration depth t at which the X-ray intensity is 1/e can be calculated using formula (1) below.

$$t = \frac{1}{\mu} \frac{\sin\alpha\sin(2\theta - \alpha)}{\sin\alpha + \sin(2\theta - \alpha)} \cos\psi \qquad (1)$$

Here, μ is the X-ray absorption coefficient, and ψ is the angle formed by the diffraction plane and the sample surface. It should be noted, however, that because when an angle γ formed by the incident X-ray Xi and the sample surface is smaller than a critical angle β (in GaN, approximately 0.345 degrees), the X-ray causes total reflection, the X-ray which penetrates into the sample is considered to form evanescent light, and that the penetration depth $t_e$ at which the X-ray intensity is 1/e is expressed by (see, for example, previously listed J. Appl. Phys. 50 (1979) 6927):

$$t_e = \frac{1}{\mu}\sqrt{\frac{\sin^2\gamma - \beta^2}{2} + \sqrt{\frac{(\sin^2\gamma - \beta^2)^2}{4} + \left(\frac{\lambda\mu}{4\pi}\right)^2}} \quad (2)$$

Here, λ is the X-ray wavelength, and approximately 0.1542 nm for CuKα$_1$.

Specifically, the crystalline plane to use for evaluation may in principle be chosen so that the previously described conical surface is intersected by the substrate surface (it should be noted, however, that it is necessary that an angle formed by the central axis of the cone and the sample surface is greater than zero). For example, the substrate whose principal surface is a C-plane is considered to use diffraction off {10-11}, {10-12}, {10-13}, {11-22} or the like. The substrate whose principal surface is an M-plane is considered to use diffraction off {10-10}, {10-11}, {10-12}, {10-13}, {11-20}, {11-22} or the like. The substrate whose principal surface is an A-plane is considered to use diffraction off {10-10}, {11-20}, {11-22} or the like. It should be noted, however, that because the desired incident angle may be unable to be realized due to mechanical constraints of a goniometer of an X-ray diffraction apparatus used, it is necessary to choose the crystalline plane to avoid it.

The nitride semiconductor substrate according to the invention may be a hetero epitaxial wafer with an underlying hetero substrate, but preferably a freestanding substrate formed of only a nitride crystal, as described above. In order for the freestanding substrate to have the previously described strength, it is preferable that the freestanding substrate have a thickness of not less than 200 µm, and not more than 1 mm, taking into account ease of cleavage after device element formation. The thickness of the freestanding substrate exceeding 1 mm may cause difficulty in cleavage, and render its cleaved surface uneven. This may, for example in application to a semiconductor laser, lead to deterioration in device properties due to reflective loss.

It is preferable that the freestanding substrate have a diameter of not less than 25 mm. The diameter of the freestanding substrate depends on the diameter of the underlying substrate (seed crystal substrate) used during fabrication. The use of the underlying substrate having a large diameter permits the resulting freestanding substrate to have a large diameter. For example, the use of a commercial 6 inch (152.4 mm) diameter sapphire substrate permits a resulting GaN seed crystal substrate to have a diameter of 6 inch, and further, the use of the GaN seed crystal substrate permits a resulting GaN freestanding substrate according to the invention to have a diameter of approximately 6 inch or less.

EXAMPLES

The nitride semiconductor substrate, production method therefor, and nitride semiconductor device according to the invention are further described, by way of specific examples below. In this case, Comparative examples 1 and 2 using prior art are first described, and further Example 1 of the present invention devised based on these Comparative examples 1 and 2 is then described. Following that, likewise described are, in turn, Comparative example 3 and Example 2, Comparative example 4 and Example 3, Comparative example 5 and Example 4, and Comparative example 6 and Example 5. The present invention is not limited by any of the Examples and Comparative examples below.

Comparative Example 1

C-Plane GaN

Figure 2:
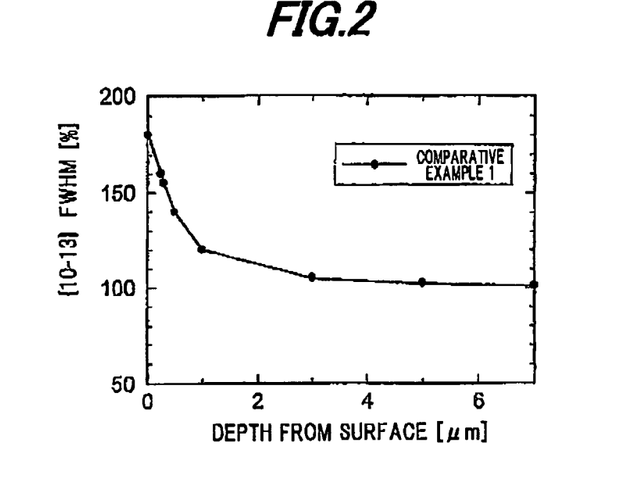
FIG. 2 is a graph showing the relationship between the rocking curve FWHM resulting from X-ray surface measurement and the depth from surface of a GaN substrate in Comparative example 1.

First is prepared a 3 inch diameter GaN single crystal substrate whose surface is a C-plane. Using this GaN substrate for a seed crystal, a 5 mm thick GaN is homo-epitaxially grown by the HVPE, to produce a GaN ingot. This ingot is sliced parallel to the C-plane using a wire saw, to produce a plurality of 600 µm thick wafer blanks. The surface (Ga face) of one of the wafer blanks is mechanically polished using an average 3 µm grain diameter diamond abrasive. Here, the crystallinity of the surface layer of the processed GaN substrate is studied by X-ray diffraction. Specifically, {10-13} diffraction is measured by varying an X-ray incident angle, to study the relationship between the X-ray incident angle (penetration depth) and the {10-13} FWHM. The X-ray diffraction measurement uses X'Pert-MRD available from Spectris Co., Ltd. Its X-ray tube positive electrode material uses copper (Cu), and its acceleration voltage is 45 kV, and its filament current is 40 mA. An optical system at a fore end of the tube comprises, in turn, a ½° divergence slit, an X-ray mirror, a two Ge (220) crystal monochromator, and a 0.1 mm lateral width and 1 mm longitudinal width cross slit collimator. The X-ray uses CuKα$_1$. Its results are shown in FIG. 2. The results are normalized to take the FWHM at a sufficiently inner portion of the crystal to be 100%. The {10-13} FWHM is substantially constant at depths of deeper than 3 µm from the surface, while significantly increases at depths of shallower than 3 µm. This shows that the mechanical polishing using the average 3 µm diameter diamond grains causes residual damage to the surface due to the mechanical processing.

Comparative Example 2

C-Plane GaN

Figure 3:
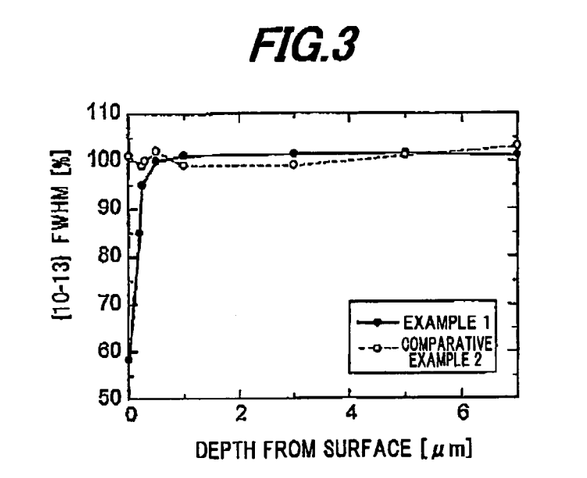
FIG. 3 is graphs showing the relationships between the rocking curve FWHMs resulting from X-ray surface measurement and the depths from surfaces of GaN substrates in Example 1 and Comparative example 2 respectively.

Comparative example 1 is followed by further mechanical polishing using, in turn, 1 µm and 0.1 µm diamond abrasives, to mirror finish the surface. At this point, the root mean square (RMS) of the surface is approximately 0.5 nm. This is followed by dry etching using reactive ion etching (RIE). The amount etched is approximately 1.5 µm. Here, the X-ray evaluation is again performed in the same manner as in Comparative example 1. Its results are shown in FIG. 3. It is seen that the {10-13} FWHM substantially does not vary with depth, and thus that the crystallinity of the resulting surface is substantially the same as the crystallinity of the inside of the crystal.

Example 1

C-Plane GaN

Comparative example 2 is followed by the below-described steps of processing this substrate surface. First is prepared a 1 mol % ammonium fluoride solution with gallium oxide nanopowder (average particle diameter: less than 50 nm) dispersed thereinto. Subsequently, the substrate is attached to a polishing shaft. Using a Teflon (registered trademark) polishing pad, and rotating the substrate at 20 rpm and a surface plate (Ø 400 mm) at 80 rpm, the substrate is polished. Dripping the prepared solution as needed, the polished substrate is irradiated with xenon lamp ultraviolet rays (irradiation intensity: 100 mW/cm$^2$) for approximately 3 hours. The processing is again followed by the X-ray evaluation in the same manner as in Comparative examples 1 and 2. Its results are shown in FIG. 3, together with the results of Comparative example 2. The results are normalized to take the FWHM at a sufficiently inner portion of the crystal to be 100%. The {10-13} FWHM is as substantially constant as not less than 95% at depths of deeper than approximately 0.3 μm from the surface, while sharply decreases at depths of shallower than approximately 0.3 μm. It is found that the {10-13} FWHM decreases at a depth of 300 nm to approximately 95% of the value for the inside of the crystal, at a depth of 250 nm to approximately 85% of the value for the inside of the crystal, and at a depth of 20 nm to approximately 58% of the value for the inside of the crystal. This shows that the crystalline orientation is more inhibited from varying in the surface region at the depths of from 0 to 250 nm from the surface than in the inner region, and thus that the surface region at the depths of from 0 to 250 nm from the surface has the excellent crystallinity.

Comparative Example 3

M-Plane GaN

Figure 4:
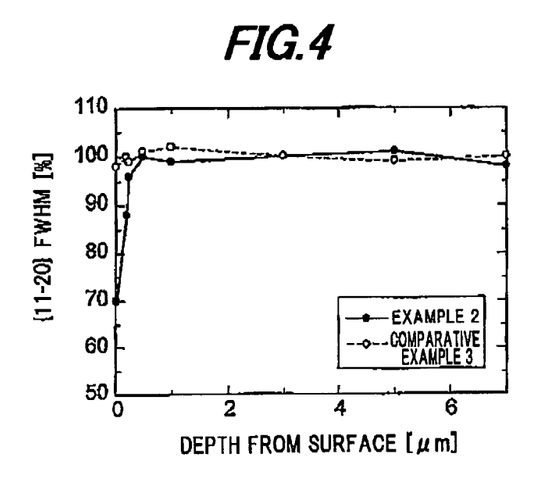
FIG. 4 is graphs showing the relationships between the rocking curve FWHMs resulting from X-ray surface measurement and the depths from surfaces of GaN substrates in Example 2 and Comparative example 3 respectively.

First is prepared a 2 inch diameter GaN single crystal substrate whose surface is a C-plane. Using this GaN substrate for a seed crystal, a 15 mm thick GaN is homo-epitaxially grown by the HYPE, to produce a GaN ingot. This ingot is sliced parallel to an M-plane using a wire saw, to produce a plurality of 600 μm thick wafer blanks. The surface (M-plane) of one of the wafer blanks is mechanically polished using an average 3 μm grain diameter diamond abrasive. This is followed by further mechanical polishing using, in turn, 1 μm and 0.1 μm diamond abrasives, to mirror finish the surface. At this point, the RMS of the surface is approximately 1 nm. This is followed by the CMP using colloidal silica. At this point, the RMS of the surface is approximately 0.4 nm. Here, the X-ray evaluation is again performed in the same manner as in Example 1. It should be noted, however, that the {10-13} diffraction is replaced with {10-20} diffraction. Its results are shown in FIG. 4. The results are normalized to take the FWHM at a sufficiently inner portion of the crystal to be 100%. It is seen that the {10-20} FWHM substantially does not vary with depth, and thus that the crystallinity of the resulting surface is substantially the same as the crystallinity of the inside of the crystal.

Example 2

M-Plane GaN

Comparative example 3 is followed by the below-described steps of processing this substrate surface. First is prepared a 0.5 mol % ammonium fluoride solution with gallium oxide nanopowder (average particle diameter: less than 50 nm) dispersed thereinto. Subsequently, the substrate is attached to a polishing shaft. Using a polyurethane polishing pad, and rotating the substrate at 20 rpm and a surface plate (Ø 400 mm) at 80 rpm, the substrate is polished. Dripping the prepared solution as needed, the polished substrate is irradiated with xenon lamp ultraviolet rays (irradiation intensity: 50 mW/cm$^2$) for approximately 3 hours. The processing is again followed by the X-ray evaluation in the same manner as in the previous examples. Its results are shown in FIG. 4, together with the results of Comparative example 3. The results are normalized to take the FWHM at a sufficiently inner portion of the crystal to be 100%. The {10-20} FWHM is as substantially constant as not less than 96% at depths of deeper than approximately 0.3 μm from the surface, while sharply decreases at depths of shallower than approximately 0.3 μm. It is found that the {10-20} FWHM decreases at a depth of 300 nm to approximately 96% of the value for the inside of the crystal, at a depth of 250 nm to approximately 88% of the value for the inside of the crystal, and at a depth of 20 nm to approximately 70% of the value for the inside of the crystal. This shows that the crystalline orientation is more inhibited from varying in the surface region at the depths of from 0 to 250 nm from the surface than in the inner region, and thus that the surface region at the depths of from 0 to 250 nm from the surface has the excellent crystallinity.

Comparative Example 4

(10-11) Plane GaN

Figure 5:
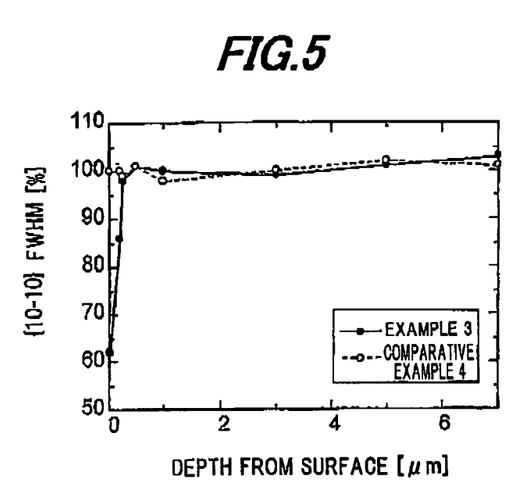
FIG. 5 is graphs showing the relationships between the rocking curve FWHMs resulting from X-ray surface measurement and the depths from surfaces of GaN substrates in Example 3 and Comparative example 4 respectively.

First is prepared a 2 inch diameter GaN single crystal substrate whose surface is a C-plane. Using this GaN substrate for a seed crystal, a 15 mm thick GaN is homo-epitaxially grown by the HVPE, to produce a GaN ingot. This ingot is sliced parallel to a {10-11} plane using a wire saw, to produce a plurality of 600 μm thick wafer blanks. The surface (Ga face) of one of the wafer blanks is mechanically polished using an average 3 μm grain diameter diamond abrasive. This is followed by further mechanical polishing using, in turn, 1 μm and 0.1 μm diamond abrasives, to mirror finish the surface. At this point, the RMS of the surface is approximately 0.7 nm. This is followed by the dry etching using RIE. The amount etched is approximately 1 μm. Here, the X-ray evaluation is again performed in the same manner as in Example 1. It should be noted, however, that the measurement uses the {10-10} diffraction. Its results are shown in FIG. 5. The results are normalized to take the FWHM at a sufficiently inner portion of the crystal to be 100%. It is seen that the {10-10} FWHM substantially does not vary with depth, and thus that the crystallinity of the resulting surface is substantially the same as the crystallinity of the inside of the crystal.

Example 3

(10-11) Plane GaN

Comparative example 4 is followed by the below-described steps of processing this substrate surface. First is prepared a 1 mol % ammonium fluoride solution with gallium oxide nanopowder (average particle diameter: less than 50 nm) dispersed thereinto. Subsequently, the substrate is attached to a polishing shaft. Using a polyurethane polishing pad, and rotating the substrate at 20 rpm and a surface plate (Ø 400 mm) at 80 rpm, the substrate is polished. Dripping the prepared solution as needed, the polished substrate is irradiated with xenon lamp ultraviolet rays (irradiation intensity: 20 mW/cm$^2$) for approximately 3 hours. The processing is again followed by the X-ray evaluation in the same manner as in the previous examples. Its results are shown in FIG. 5, together with the results of Comparative example 4. The results are normalized to take the FWHM at a sufficiently inner portion of the crystal to be 100%. The {10-10} FWHM is as substantially constant as not less than 98% at depths of deeper than approximately 0.3 μm from the surface, while sharply decreases at depths of shallower than approximately 0.3 μm. It is found that the {10-10} FWHM decreases at a depth of 300 nm to approximately 98% of the value for the inside of the crystal, at a depth of 250 nm to approximately 86% of the value for the inside of the crystal, and at a depth of 20 nm to approximately 62% of the value for the inside of the crystal. This shows that the crystalline orientation is more inhibited from varying in the surface region at the depths of from 0 to 250 nm from the surface than in the inner region, and thus that the surface region at the depths of from 0 to 250 nm from the surface has the excellent crystallinity.

Comparative Example 5

C-Plane AlN

Figure 6:
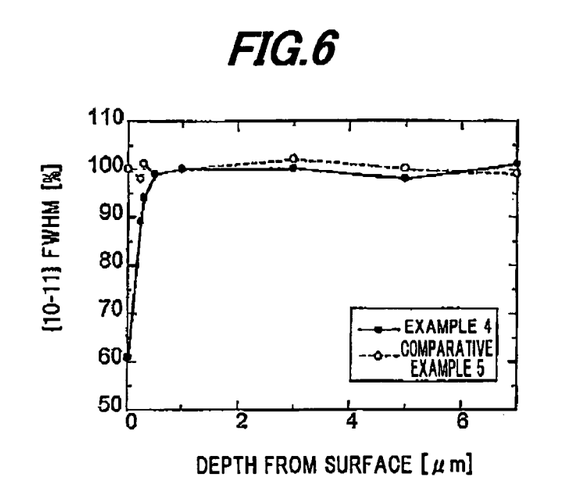
FIG. 6 is graphs showing the relationships between the rocking curve FWHMs resulting from X-ray surface measurement and the depths from surfaces of AlN substrates in Example 4 and Comparative example 5 respectively.

First is prepared a 1 inch diameter AlN single crystal substrate whose surface is a C-plane. Using this AlN substrate for a seed crystal, a 10 mm thick AlN is homo-epitaxially grown by sublimation, to produce an AlN ingot. This ingot is sliced parallel to the C-plane using a wire saw, to produce a plurality of 600 μm thick wafer blanks. The surface (Al face) of one of the wafer blanks is mechanically polished using an average 3 μm grain diameter diamond abrasive. This is followed by further mechanical polishing using, in turn, 1 μm and 0.1 μm diamond abrasives, to mirror finish the surface. At this point, the RMS of the surface is approximately 0.6 nm. This is followed by the dry etching using RIE. The amount etched is approximately 1 μm. Here, the X-ray evaluation is again performed in the same manner as in Example 1. It should be noted, however, that the measurement uses the {10-11} diffraction. Its results are shown in FIG. 6. The results are normalized to take the FWHM at a sufficiently inner portion of the crystal to be 100%. It is seen that the {10-11} FWHM substantially does not vary with depth, and thus that the crystallinity of the resulting surface is substantially the same as the crystallinity of the inside of the crystal.

Example 4

C-Plane AlN

Comparative example 5 is followed by the below-described steps of processing this substrate surface. First is prepared a 1.5 mol % ammonium fluoride solution with gallium oxide nanopowder (average particle diameter: less than 50 nm) dispersed thereinto. Subsequently, the substrate is attached to a polishing shaft. Using a polyurethane polishing pad, and rotating the substrate at 20 rpm and a surface plate (Ø 400 mm) at 80 rpm, the substrate is polished. Dripping the prepared solution as needed, the polished substrate is irradiated with xenon lamp ultraviolet rays (irradiation intensity: 35 mW/cm$^2$) for approximately 3 hours. The processing is again followed by the X-ray evaluation in the same manner as in the previous examples. Its results are shown in FIG. 6, together with the results of Comparative example 5. The results are normalized to take the FWHM at a sufficiently inner portion of the crystal to be 100%. The {10-11} FWHM is as substantially constant as not less than 94% at depths of deeper than approximately 0.3 μm from the surface, while sharply decreases at depths of shallower than approximately 0.3 μm. It is found that the {10-11} FWHM decreases at a depth of 300 nm to approximately 94% of the value for the inside of the crystal, at a depth of 250 nm to approximately 89% of the value for the inside of the crystal, and at a depth of 20 nm to approximately 61% of the value for the inside of the crystal. This shows that the crystalline orientation is more inhibited from varying in the surface region at the depths of from 0 to 250 nm from the surface than in the inner region, and thus that the surface region at the depths of from 0 to 250 nm from the surface has the excellent crystallinity.

Comparative Example 6

C-Plane AlGaN

Figure 7:
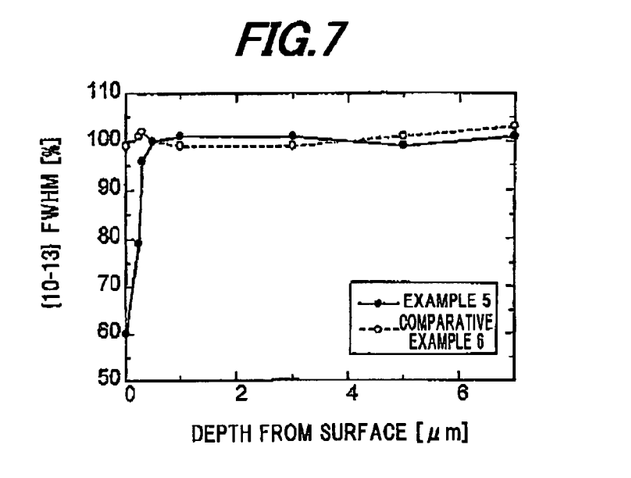
FIG. 7 is graphs showing the relationships between the rocking curve FWHMs resulting from X-ray surface measurement and the depths from surfaces of AlGaN substrates in Example 5 and Comparative example 6 respectively.

First is prepared a 2 inch diameter and 400 μm thick GaN single crystal substrate whose surface is a C-plane. Using this GaN substrate for a seed crystal, a 100 μm thick $Al_{0.1}Ga_{0.9}N$ is epitaxially grown by the HVPE, to produce a hetero epitaxial substrate. The surface (AlGaN layer) of this hetero epitaxial substrate is mechanically polished using an average 3 μm grain diameter diamond abrasive. This is followed by further mechanical polishing using, in turn, 1 μm and 0.1 μm diamond abrasives, to mirror finish the surface. At this point, the RMS of the surface is approximately 0.6 nm. This is followed by the dry etching using RIE. The amount etched is approximately 1 μm. Here, the X-ray evaluation is again performed in the same manner as in Example 1. It should be noted, however, that the measurement uses the {10-13} diffraction. Its results are shown in FIG. 7. The results are normalized to take the FWHM at a sufficiently inner portion of the crystal to be 100%. It is seen that the {10-13} FWHM substantially does not vary with depth, and thus that the crystallinity of the resulting surface is substantially the same as the crystallinity of the inside of the crystal.

Example 5

C-Plane AlGaN

Comparative example 6 is followed by the below-described steps of processing this substrate surface. First is prepared a 1 mol % ammonium fluoride solution with gallium oxide nanopowder (average particle diameter: less than 50 nm) dispersed thereinto. Subsequently, the substrate is attached to a polishing shaft. Using a polyurethane polishing pad, and rotating the substrate at 20 rpm and a surface plate (Ø 400 mm) at 80 rpm, the substrate is polished. Dripping the prepared solution as needed, the polished substrate is irradiated with xenon lamp ultraviolet rays (irradiation intensity: 25 mW/cm$^2$) for approximately 3 hours. The processing is again followed by the X-ray evaluation in the same manner as in the previous examples. Its results are shown in FIG. 7, together with the results of Comparative example 6. The results are normalized to take the FWHM at a sufficiently inner portion of the crystal to be 100%. The {10-13} FWHM is as substantially constant as not less than 96% at depths of deeper than approximately 0.3 μm from the surface, while sharply decreases at depths of shallower than approximately 0.3 μm. It is found that the {10-13} FWHM decreases at a depth of 300 nm to approximately 96% of the value for the inside of the crystal, at a depth of 250 nm to approximately 79% of the value for the inside of the crystal, and at a depth of 20 nm to approximately 60% of the value for the inside of the crystal. This shows that the crystalline orientation is more inhibited from varying in the surface region at the depths of from 0 to 250 nm from the surface than in the inner region, and thus that the surface region at the depths of from 0 to 250 nm from the surface has the excellent crystallinity.

Modification

Besides the HVPE used in each of the Examples and Comparative examples above, the growing method may likewise use a solution growth method, such as a high temperature and high pressure method, a Na flux method, an ammonothermal method, or the like.

Example 6

Nitride Semiconductor Device

Light Emitting Diode (LED) Device

Example 6 describes applying the above-described nitride semiconductor substrate to a light emitting diode as one example of a nitride semiconductor device.

Figure 8:
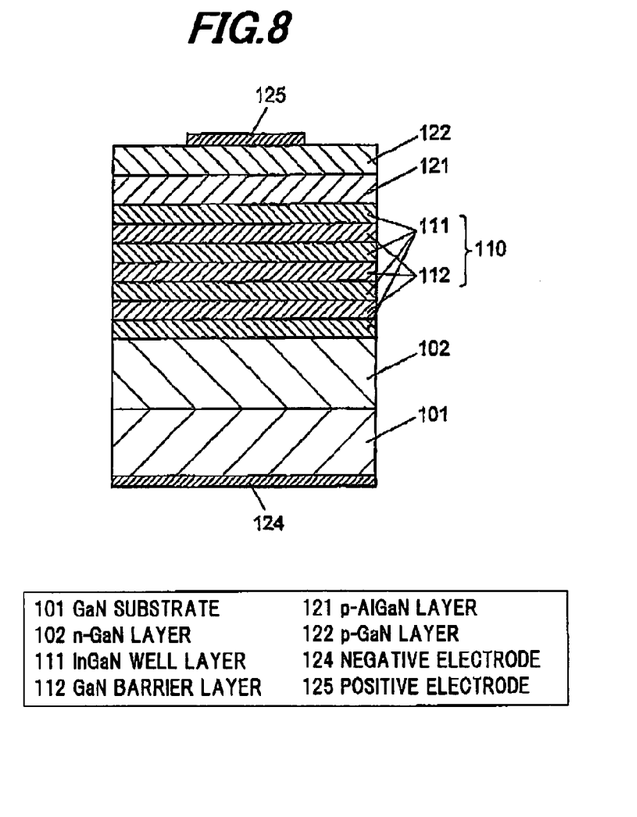
FIG. 8 is a cross sectional view showing a light emitting diode (LED) as one typical example of a nitride semiconductor device using a nitride semiconductor substrate.

FIG. 8 is a cross sectional view showing a light emitting diode (LED) as one typical example of a nitride semiconductor device using the nitride semiconductor substrate. The light emitting diode in this example has a quantum well structure. A multilayer film for the light emitting diode is fabricated by known metal organic chemical vapor deposition (MOCVD). Its metal organic materials used are trimethyl gallium (TMG), trimethyl aluminum (TMA), trimethyl indium (TMI), and biscyclopentadienyl magnesium ($Cp_2Mg$). Its gas materials used are ammonia ($NH_3$) and silane ($SiH_4$). Also, its carrier gases used are hydrogen and nitrogen.

The light emitting diode in this example is fabricated as follows. First, grown at 1050° C. over the GaN freestanding substrate 101 resulting from the Examples above is a 4 μm thick n-type GaN layer 102 doped with Si ($1\times10^{19}$ $cm^3$). Subsequently, grown at 800° C. is an InGaN based active layer 110 having a multi-quantum well structure (MQW) comprising three 3 μm thick $In_{0.1}Ga_{0.9}N$ well layers 111, and four 10 nm thick GaN barrier layers 112. Formed thereover are, in turn, a p-type $Al_{0.1}Ga_{0.9}N$ cladding layer 122, and a p-type GaN contact layer 122. The growing is followed by taking the wafer out from the MOCVD apparatus, and providing a Ni and Au containing positive electrode 125 for the top p-type GaN contact layer 122, and a Ti and Al containing negative electrode 124 on the backside of the GaN substrate 101, and thereafter separating the wafer into a 350 μm square chip, resulting in a light emitting diode (LED) element.

What is claimed is:

1. A nitride semiconductor substrate, comprising:
two principal surfaces comprising an upper surface that is a growth face and a lower surface on its opposite side, wherein a full width at half maximum (FWHM) in a surface layer of the substrate at depths of from 0 to 250 nm from the upper surface is narrower than an FWHM in an inner layer of the substrate at depths exceeding 5 μm from the upper surface, where the FWHMs are obtained by X-ray rocking curve measurement using diffraction off a particular asymmetric plane of the substrate inclined relative to the upper surface, and
wherein the FWHM in the surface layer of the substrate is not more than 90% of the FWHM in the inner layer of the substrate.

2. The nitride semiconductor substrate according to claim 1, wherein the substrate comprises a GaN freestanding substrate, an AlN freestanding substrate, or an $Al_xGa_{1-x}N$ freestanding substrate ($0\leq x \leq 1$).

3. The nitride semiconductor substrate according to claim 1, wherein the asymmetric plane is chosen so as to satisfy a specific condition shown below:
when an apex of a virtual cone, whose axis is normal to the asymmetric plane and an apex angle of (180-2θ) degrees wherein θ is a Bragg angle of the asymmetric plane, is put on a sample surface, the virtual cone and the sample surface intersect each other.

4. The nitride semiconductor substrate according to claim 3, wherein the upper surface comprises a {0001} plane or a plane slightly inclined at not more than 10 degrees thereto, while the asymmetric plane comprises a {10-11}, {10-12}, {10-13}, {20-21}, or {11-22} plane.

5. The nitride semiconductor substrate according to claim 3, wherein the upper surface comprises a {10-10} plane or a plane slightly inclined at not more than 10 degrees thereto, while the asymmetric plane comprises a {10-11}, {10-12}, {10-13}, {10-14}, {10-15}, {10-16}, {11-20}, or {11-22} plane.

6. The nitride semiconductor substrate according to claim 3, wherein the upper surface comprises a {11-20} plane or a plane slightly inclined at not more than 10 degrees thereto, while the asymmetric plane comprises a {10-10} or {11-22} plane.

7. The nitride semiconductor substrate according to claim 3, wherein the upper surface comprises a {11-22} plane or a plane slightly inclined at not more than 10 degrees thereto, while the asymmetric plane comprises a {0001} or {11-20} plane.

8. The nitride semiconductor substrate according to claim 3, wherein the upper surface comprises a {10-11} plane or a plane slightly inclined relative thereto, while the asymmetric plane comprises a {0001} or {10-10} plane.

9. The nitride semiconductor substrate according to claim 3, wherein the upper surface comprises a {10-12} plane or a plane slightly inclined relative thereto, while the asymmetric plane comprises a {0001}, {10-10}, or {10-11} plane.

10. The nitride semiconductor substrate according to claim 3, wherein the upper surface comprises a {20-21} plane or a plane slightly inclined relative thereto, while the asymmetric plane comprises a {0001}, {10-12}, {10-13}, {10-14}, or {10-15} plane.

11. A nitride semiconductor device, comprising:
the nitride semiconductor substrate according to claim 1; and
an epitaxial layer comprising a nitride semiconductor substrate crystal formed over the nitride semiconductor substrate.

12. A method for producing a nitride semiconductor substrate, said nitride semiconductor substrate comprising:
two principal surfaces comprising an upper surface that is a growth face and a lower surface on its opposite side,
wherein an FWHM (full width at half maximum) in a surface layer of the substrate at depths of from 0 to 250 nm from the upper surface is narrower than an FWHM in an inner layer of the substrate at depths exceeding 5 μm from the upper surface, where the FWHMs are obtained by X-ray rocking curve measurement using diffraction off a particular asymmetric plane of the substrate inclined relative to the upper surface,
said method comprising:
mechanically polishing or surface grinding a surface of a single crystal to form a principal surface so that a root mean square (RMS) is not more than 5 nm;
subsequently chemically mechanically polishing (CMP) with colloidal silica or dry etching the surface to reduce damage caused by the mechanical polishing or the surface grinding so that the RMS is not more than 2 nm; and
subsequently dripping onto the surface a not more than 2 mol % ammonium fluoride containing solution with not more than 100 nm particle diameter gallium oxide nanopowder added thereto, and irradiating the surface with ultraviolet rays over 1 hour, to apply friction to the surface.

* * * * *